United States Patent [19]

Mori et al.

[11] Patent Number: 4,977,321

[45] Date of Patent: Dec. 11, 1990

[54] ELECTRON MICROSCOPE WHICH PREVENTS UNDESIRED X-RAY EXPOSURE

[75] Inventors: Nobufumi Mori, Kaisei; Tetsuo Oikawa, Akishima, both of Japan

[73] Assignee: Fuji Photo Film Co., Ltd., Kanagawa, Japan

[21] Appl. No.: 265,381

[22] Filed: Oct. 31, 1988

[30] Foreign Application Priority Data

Oct. 30, 1987 [JP] Japan .................... 62-275547

[51] Int. Cl.⁵ .......................... H01J 37/26
[52] U.S. Cl. ...................... 250/311; 250/306
[58] Field of Search ............ 250/310, 311, 306

[56] References Cited

U.S. PATENT DOCUMENTS

| | | | |
|---|---|---|---|
| 3,671,742 | 6/1972 | Browning | 250/311 |
| 4,623,794 | 11/1986 | Rose et al. | 250/396 R |
| 4,713,543 | 12/1987 | Feuerbaum et al. | 250/311 |
| 4,742,216 | 5/1988 | Morse et al. | 250/311 |
| 4,745,362 | 5/1988 | Brust | 250/310 |
| 4,810,886 | 3/1989 | Mori et al. | 250/311 |

Primary Examiner—Bruce D. Anderson
Attorney, Agent, or Firm—Sughrue, Mion, Zinn, Macpeak & Seas

[57] ABSTRACT

An exposed two-dimensional sensor and an exposed two-dimensional sensor in the camera compartment of an electron microscope are shielded against X-rays by respective covers. When a two-dimensional sensor is outside the protective covers during recording, the electron beam from the electron gun of the electron microscope is deflected and blocked by the diaphragm, thereby preventing generation of X-rays due to scattered electrons in the camera compartment. Such an arrangement makes a mechanical shutter unnecessary so that it is possible to prevent exposure of the two-dimensional sensors due to X-rays generated at the shutter and exposure of the two-dimensional sensors due to X-rays generated by scattered electrons in the camera compartment.

6 Claims, 3 Drawing Sheets

ELECTRON MICROSCOPE WHICH PREVENTS UNDESIRED X-RAY EXPOSURE

BACKGROUND OF THE INVENTION

This invention relates to an electron microscope and, more particularly, to an electron microscope adapted to prevent exposure due to X rays generated by scattered electrons in a camera compartment of the microscope.

In general, an electron microscope employs a mechanical shutter to perform photography. The construction of a conventional electron microscope using such a mechanical shutter is illustrated in FIG. 3. Shown in FIG. 3 are an electronic microscope 1, a camera compartment 2, an electron gun 3, an electron beam 4, a condenser lens 5, a specimen 6, an objective lens 7, a magnifying lens 8, a shutter 9, a recording medium transport means 10, a recording medium 11, a feeding magazine 12, a receiving magazine 13, unexposed recording medium 14 and exposed recording medum 15.

In the arrangement of FIG. 3, the shutter 9 and camera compartment 2 disposed at the lower part of the electron microscope 1 construct a photographic unit. Housed within the camera compartment 2 are the feed magazine 12 for accommodating the unexposed recording medium 14, the receiving magazine 13 for accommodatng the exposed recording medium 15, and the conveyance mechanism 10 for taking out the recording medium 11 from the feed magazine 12 and conveying it to a photographing position, and for subsequently conveying the recording medium 11 from the image formation plane to the receiving magazine 13.

In the electron microscope 1 thus constructed, the electron beam 4 from the electron gun 3 is condensed by the condenser lens 5 to irradiate the specimen 6, the electron image of which is formed by the objective lens 7. To record the electron image, the electron image is projected upon the recording medium 11, which has been supplied from the feed magazine 12, by the magnifying lens 8 for a period of time determined by the shutter 9, after which the recording medium is received by the receiving magazine 13.

Immediately before and after the electron image is recorded in the electron microscope of FIG. 3, the electron beam bombards the shutter 9, as a result of which X rays are produced. Also, during exposure, electrons are scattered within the camera compartment 2 and generate X rays. In the conventional electron microscope which uses photographic film as the recording medium 11, the photographic film has little sensitivity to X rays and almost no deposit due to X rays occurs. This makes it possible to record solely the electron image without any particular problems.

There has recently been proposed a new electron microscope system in which a two-dimensional sensor such as a stimulable phosphor sheet for storing irradiating electron beam energy is exposed to an electron beam passing through a specimen in a vacuum to have the electron beam energy stored in the two-dimensional sensor, the two-dimensional sensor is then exposed to light or heat to release the stored energy as light emission, the emitted light is photoelectrically detected to obtain an image signal, and the image of the electron beam which has passed through the specimen is reproduced by using the image signal. For example, see the specifications of U.S. patent application Ser. No. 754,996 and U.S. Pat. No. 4,651,220.

The two-dimensional sensor comprises a material which, when exposed to an electron beam, temporarily stores at least some of the electron beam energy. Then, when the material so exposed is subjected to stimulation from an external source, at least some of the stored energy is released in a detectable form as light, electricity, sound or the like. An example of a material particularly suitable for use as this two-dimensional sensor is a stimulable phosphor sheet as disclosed, for example, in Japanese Patent Application Laid-Open (KOKAI) Nos. 55-163472, 56-11395, and U.S. Pat. Nos. 4,258,264, 4,276,473, 4,387,428. More specifically, when certain kinds of phosphors are exposed to radiation such as an electron beam, they store a part of the energy of the radiation. When the phosphor which has been exposed to radiation is subsequently exposed to stimulating rays such as visible light, the phosphor exhibits light emission (fluorescence) in proportion to the stored energy. A phosphor exhibiting such properties is referred to as a stimulable phosphor. By "stimulable phosphor sheet" is meant a sheet-like recording medium comprising the aforesaid stimulable phosphor. In general, the stimulable phosphor sheet is composed of a substrate and a stimulable phosphor layer overlaid on the substrate. The stimulable phosphor layer comprises an appropriate binder and the stimulable phosphor dispersed therein, or solely the stimulable phosphor formed by vapor deposition. If the stimulable phosphor layer is self-supporting, the stimulable phosphor layer can be itself form the stimulable phosphor sheet. An example of a fluorescing phosphor for forming a stimulable phosphor layer sheet is described in detail in the aforementioned U.S. Pat. No. 4,651,220.

As the two-dimensional sensor, it is also possible to use a thermal phosphor sheet as disclosed, for example, in Japanese Patent Application Laid-Open Nos. 55-47719 and 55-47720. The thermal phosphor sheet is a sheet-line recording material primarily comprising a phosphor (thermal phosphor) which releases the stored radiation energy as thermal fluorescence mainly by the effect of heat.

In the above-described electron microscope system, the electron microscope image is stored in the two-dimensional sensor such as the stimulable phosphor sheet. This makes it possible to record the electron microscope image with high sensitivity. As a result, the amount of electronic beam exposure can be reduced to minimize damage to the specimen. In addition, it is easy to subject the electron microscope image in this system to such image processing as gradation processing and frequency response enhancement processing. Also, by applying the electric signal to a computer, it becomes possible to execute diffraction pattern processing, reconstruction of a three-dimensional image and image analysis for converting the image into binary values much more simply and rapidly in comparison with the prior art.

A problem that arises with the two aforesaid two-dimensional sensor is that since it is generally highly sensitive to X rays, the sensor is exposed by the penetrating X rays produced at the shutter 9, as a result of which the electron image is doubled. This causes a deterioration in the photographic image so that a clear image cannot be obtained.

Also, when the shutter 9 is retracted to expose the two-dimensional sensor to the electron beam, the unexposed or exposed two-dimensional sensor is exposed by the X rays generated by the scattered electrons in the camera compartment, thereby making it impossible to obtain a clear electron image.

SUMMARY OF THE INVENTION

An object of the present invention is to provide an electron microscope which, by dispensing with the mechanical shutter, prevents exposure due to X rays generated at the shutter, and which also prevents exposure due to X rays generated by scattered electrons in the camera compartment.

According to the present invention, the foregoing object is attained by providing an electron microscope for recording, on a two-dimensional sensor, an electron image obtained by irradiating a specimen with an electron beam emitted by an electron gun, comprising electron beam deflecting means provided above a diaphragm disposed at a predetermined position in a lens system, and covers for shielding an unexposed two-dimensional sensor and an exposed two-dimensional sensor in the camera compartment from X rays.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

Figure 1:
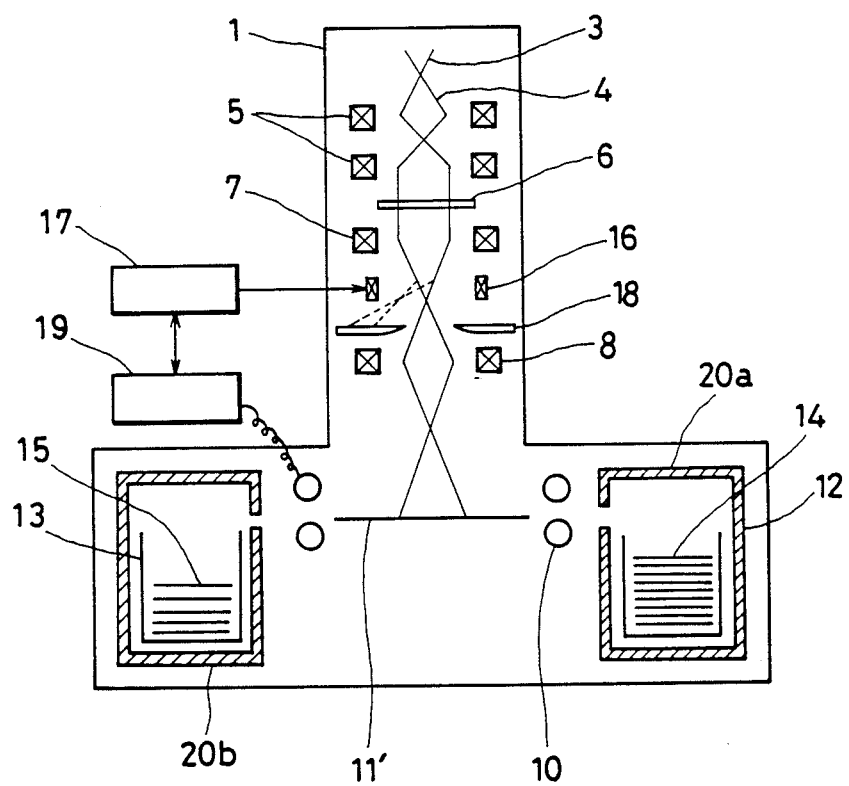
FIG. 1 is a schematic view illustrating an electron microscope according to the present invention.
Figure 3:
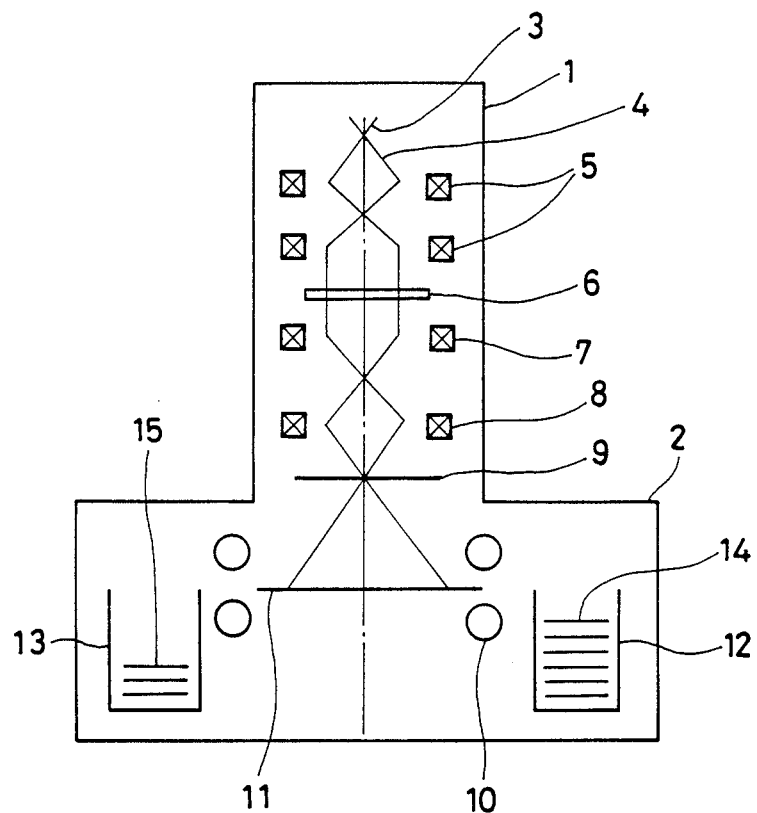
FIG. 3 is a schematic view illustrating an electron microscope according to the prior art.

FIG. 1 is a view illustrating an electron microscope according to the present invention, in which elements the same as those shown in FIG. 3 are designated by like reference characters and need not be described in detail again. Illustrated in FIG. 1 are a two-dimensional sensor 11' in a image formation plane, two-dimensional sensors 14' as yet unexposed, two-dimensional sensors 15' already exposed, a deflecting coil 16, a power supply 17 for the deflecting coil, a diaphragm 18, a transport means driving unit 19, and X-ray covers 20a, 20b for shielding the unexposed and exposed two-dimensional sensors from X rays.

When the deflecting coil 16 is supplied with voltage from the power supply 17, the electron beam 4 is deflected to the position shown by the dashed lines in FIG. 1. The diaphragm 18, which is disposed below the deflecting coil 16, blocks these deflected electrons and prevents them from irradiating the two-dimensional sensor 11'.

The deflecting coil power supply 17 and the transport means driving unit 19 exchange signals with each other. The deflecting coil power supply 17 is triggered by a signal, produced by the signal generating unit 19, indicating the end of an operation for feeding the two-dimensional sensor. A predetermined period of time after the power supply 17 is thus triggered, the power supplied to the deflecting coil 16 is cut off. The transport means driving unit 19 is triggered by a signal, produced by the deflecting coil power supply 17, indicating the end of exposure time. A predetermined period of time after the transport means driving unit 19 is thus triggered, the unit generates a feed signal to transport the two-dimensional sensor.

The operation of the electron microscope of FIG. 1 will now be described with reference to the timing waveform diagram of FIG. 2.

Figure 2:
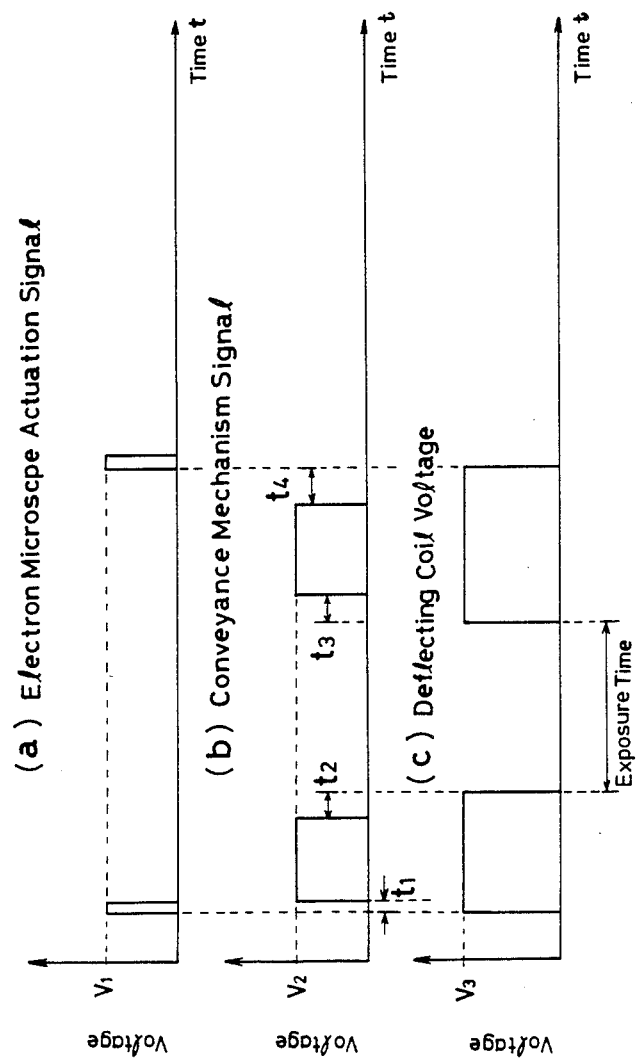
FIG. 2 is a timing waveform diagram.

In FIG. 2, (a) indicates an electron microscope actuation signal, (b) the waveform of the signal generated by the transport means driving unit, and (c) the waveform of the voltage impressed upon the deflecting coil.

When the user actuates the electron microscope, this causes a command signal voltage of level $V_1$ shown in FIG. 2(a) to be generated, as a result of which a deflecting coil voltage of level $V_3$ shown in FIG. 2(c) is produced to deflect the electron beam 4. The electron beam 4 therefore is blocked by the diaphragm 18 and does not reach the camera compartment 2. Upon elapse of a time $t_1$, a driving signal of level $V_2$ is generated, as shown in FIG. 2(b), to transport the two-dimensional sensor 11'. It should be noted that $V_1$, $V_2$ and $V_3$ are made different in order to distinguish them from one another. When the two-dimensional sensor 11' has been set at the transport position, the supply of voltage to the deflecting coil is cut off upon passage of a time $t_2$, so that the electron beam irradiates the specimen to perform exposure for a preset period of time $t_e$. At elapse of the time $t_e$, voltage is again impressed upon the deflecting coil, as shown in FIG. 2(c), whereby the electron beam is deflected and blocked by the diaphragm to end exposure. At the end of exposure, the transport signal is generated upon elapse of a time $t_3$ to start transport of the two-dimensional sensor. When the transport of the two-dimensional sensor ends, the voltage applied to the deflecting coil is cut off and, at the same time, a signal indicating the end of recording is generated, upon passage of a time $t_4$. This ends one operating cycle of the electron microscope.

By using the electron beam deflecting means and the diaphragm, the conventional mechanical shutter can be dispensed with so that it is possible to prevent the two-dimensional sensor from being exposed by the X rays emitted by the shutter. Furthermore, even if X rays should be produced owing to bombardment of the diaphragm by the electron beam, the effects thereof are almost negligible because the position of the diaphragm is remote from the two-dimensional sensor. If the diaphragm is provided above the specimen, moreover, the specimen is irradiated with the electron beam solely for the exposure time required for recording. This makes it possible to minimize damage to the specimen caused by the electron beam.

Though a deflecting coil is used to deflect the electron beam in the foregoing embodiment, an electric field-type electrostatic plate can be used instead of the deflecting coil.

It is possible to affix a layer which reduces the generation of X rays, such as a layer of a light element that does not produce X rays, e.g., carbon or beryllium, to the upper surface of the diaphragm, and to affix an X-ray absorbing layer, such as a layer of a heavy element that absorbs X rays, e.g., lead or iron, to the lower surface of the diaphragm. If such measures are taken to deal with X rays, protection against X rays can be greatly enhanced.

Thus, in accordance with the invention as described above, a diaphragm is disposed in a lens system and electron beam deflecting means is arranged above the diaphragm, thereby making a mechanical shutter unnecessary. This makes it possible to prevent exposure of the two-dimensional sensor due to X rays generated at the shutter and exposure of the two-dimensional sensor due to X rays generated by scattered electrons in the camera compartment.

As many apparently widely different embodiments of the present invention can be made without departing from the spirit and scope thereof, it is to be understood that the invention is not limited to the specific embodiments thereof except as defined in the appended claims.

What we claim is:

1. A transmission electron microscope for recording, on a two-dimension sensor in a camera compartment of said transmission electron microscope, an electron image obtained by irradiating a specimen with an electron beam emitted by an electron gun and operated upon by a lens system, comprising:
    a diaphragm disposed above said specimen at a predetermined position in a lens system of said electron microscope including a camera compartment below said specimen said diaphragm being selectively used to block an electron beam;
    electron beam deflecting means provided above said diaphragm; and
    covers for shielding an unexposed two-dimensional sensor and an exposed two-dimensional sensor in said camera compartment from X rays; wherein said diaphragm is disposed above said specimen and wherein said diaphragm has an upper surface provided with an X-ray generation reducing layer and a lower surface provided with an X-ray absorbing layer.

2. The electron microscope according to claim 1, wherein both said unexposed and said exposed two-dimensional sensors are stimulable phosphor sheets.

3. The electron microscope according to claim 1, wherein said electron beam deflecting means deflects an electron beam so that said electron beam is blocked by said diaphragm at least during conveyance of a two-dimensional sensor.

4. The electron microscope according to claim 1 wherein said electron beam deflecting means comprises a deflecting coil.

5. The electron microscope according to claim 1 wherein said electron beam deflecting means comprises an electric field-type electrostatic plate.

6. The electron microscope according to claim 1 wherein said X-ray generation reducing layer is made of one of carbon and beryllium, and said X-ray absorbing layer is made of one of lead and iron.

* * * * *